United States Patent
Li (10) Patent No.: US 6,369,636 B1
(45) Date of Patent: Apr. 9, 2002

(54) METHOD, ARCHITECTURE AND CIRCUIT FOR SELECTING, CALIBRATING AND MONITORING CIRCUITS

(75) Inventor: Gabriel Li, San Francisco, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/468,171

(22) Filed: Dec. 21, 1999

(51) Int. Cl.$^7$ ............................................... H03K 17/76
(52) U.S. Cl. ........................ 327/407; 327/99; 327/100; 327/408
(58) Field of Search ........................ 327/99, 100, 407, 327/408

(56) References Cited

U.S. PATENT DOCUMENTS

| | | | |
|---|---|---|---|
| 5,015,970 A | 5/1991 | Williams et al. | 331/11 |
| 5,081,705 A | 1/1992 | Swanke | 455/73 |
| 5,130,565 A | * 7/1992 | Girmay | 327/175 |
| 5,703,489 A | * 12/1997 | Kuroe | 324/601 |
| 5,952,888 A | 9/1999 | Scott | 331/2 |

OTHER PUBLICATIONS

Cypress Data Communication Data Book, CY7B951, Local Area Network ATM Transceiver, 1996, pp. 3–1 to 3–8.
Cypress Data Communications Data Book, CY7B952 SONET/SDH Serial Transceiver, 1996, pp. 3–9 to 3–15.
Cypress Data Communications Data Book, CY7B923 CY7B933, Transmitter/Receiver, 1996, pp. 4–1 to 4–27.
Practical Data Communications by Roger L. Freeman, 1995, pp. 130 to 286; John Wiley & Sons, Inc.
Cypress CY7C955, AX™ ATM–SONET/SDH Transceiver, Jul. 1997, pp. 2 to 76.

* cited by examiner

Primary Examiner—Kenneth B. Wells
(74) Attorney, Agent, or Firm—Christopher P. Maiorana, P.C.

(57) ABSTRACT

A circuit including a plurality of first calibration circuits, a second circuit and a third circuit. The plurality of calibration circuits may each be configured to present a calibration signal. The second circuit may be configured to select one of the calibration signals in response to a plurality of configuration signals. The third circuit may be configured to generate a control signal in response to (i) a reference signal and (ii) the selected calibration signal.

17 Claims, 7 Drawing Sheets

METHOD, ARCHITECTURE AND CIRCUIT FOR SELECTING, CALIBRATING AND MONITORING CIRCUITS

FIELD OF THE INVENTION

The present invention relates to calibrating circuits generally and, more particularly, to a method, architecture and circuit for selecting, calibrating and monitoring a plurality of circuits.

BACKGROUND OF THE INVENTION

A conventional approach to calibrating circuits is to (i) calibrate a single buffer during chip power-up and (ii) program any remaining buffers to that calibrated value. An example of this approach is the "Programmable Output Impedance Circuit" used by the 1302 PAQ SRAM chip, the data sheet of which is hereby incorporated by reference in its entirety.

Because the 1302 PAQ SRAM chip has output buffers located on opposite sides of the chip die, a single cycle calibration approach does not accurately account for process times of uncalibrated outputs located away from the calibrated output. As a result, the conventional calibration approach produces a mismatch in process times introducing an error of +/−5% or more.

SUMMARY OF THE INVENTION

The present invention concerns a circuit comprising a plurality of first calibration circuits, a second circuit and a third circuit. The plurality of calibration circuits may each be configured to present a calibration signal. The second circuit may be configured to select one of the calibration signals in response to a plurality of configuration signals. The third circuit may be configured to generate a control signal in response to (i) a reference signal and (ii) the selected calibration signal.

The objects, features and advantages of the present invention include providing a circuit that may (i) calibrate a plurality of circuits, (ii) monitor the calibration of a plurality of circuits and/or (iii) continuously monitor and calibrate a plurality of circuits.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
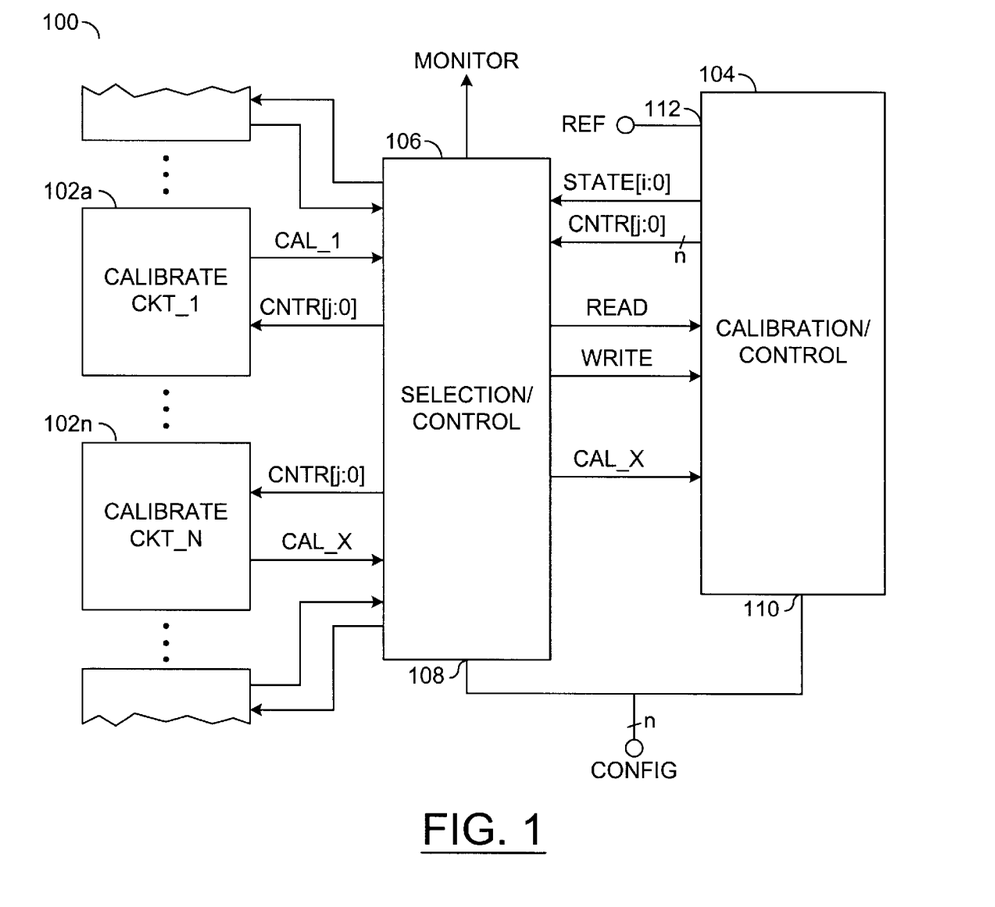
FIG. 1 is a block diagram of a preferred embodiment of the present invention.

Referring to FIG. 1, a block diagram of a circuit 100 is shown in accordance with a preferred embodiment of the present invention. The circuit 100 generally comprises a plurality of calibration blocks (or circuits) 102a–102n, a selection/control block (or circuit) 106 and a calibration/control block (or circuit) 104. A plurality of configuration signals (e.g., CONFIG) may be presented to (i) an input 108 of the selection/control circuit 106 and (ii) an input 110 of the calibration control circuit 104. A reference signal (e.g., REF) may be presented to an input 112 of the calibration/control circuit 104.

The selection/control circuit 106 may be configured to (i) select a calibration signal (e.g., CAL_X) presented by one of the plurality of calibration circuits 102a–102n and (ii) present the signal CAL_X to the calibration/control circuit 104 in response to the calibration signals CONFIG. The calibration/control circuit 104 may be configured to generate one or more control signals (e.g., CNTRL [j:0] and STAT [i:0]) in response to (i) the signal REF, (ii) the signal CAL_X and (iii) the signal CONFIG. The selection/control circuit 106 may be further configured to (i) write the signals CNTRL [j:0] to the selected calibration circuit 102a–102n, (ii) read the signals CNTRL [j:0] and/or (iii) present the signals CNTRL [j:0] to an external device in response to the configuration signals CONFIG.

Figure 2:
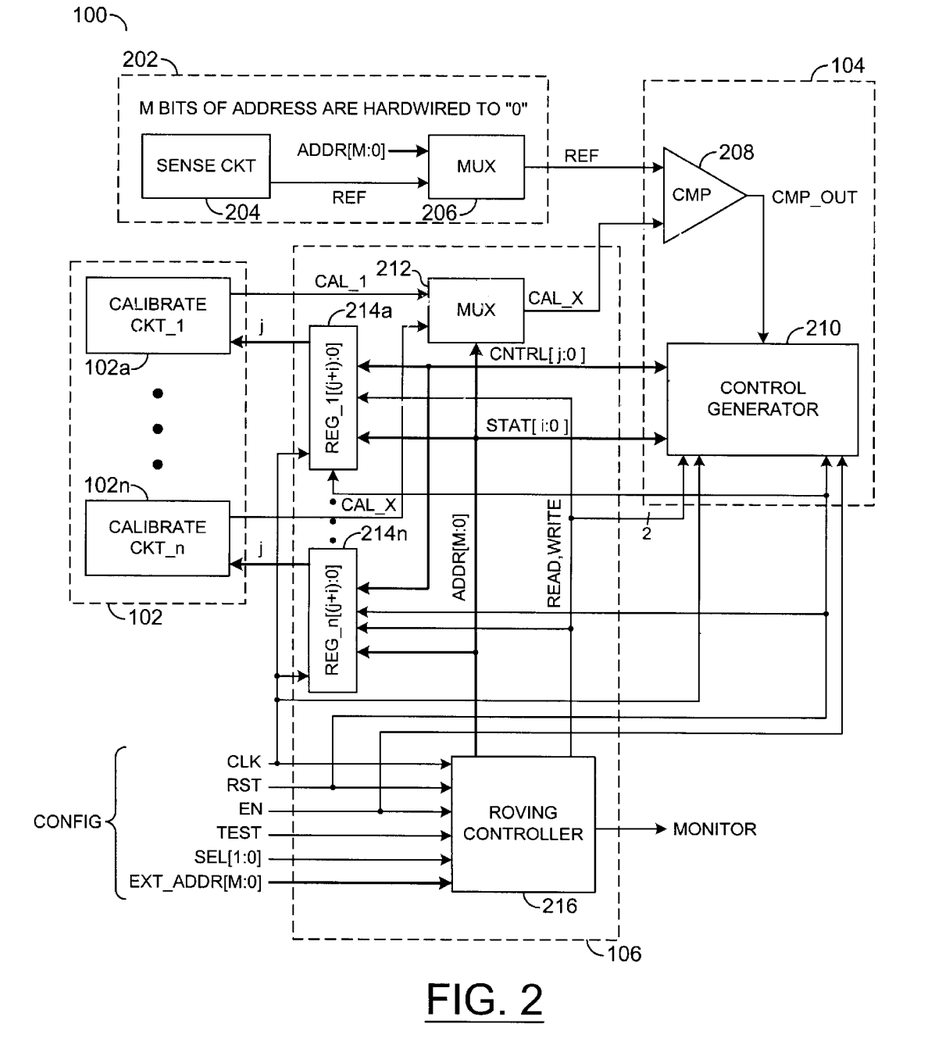
FIG. 2 is a more detailed block diagram of the preferred embodiment of FIG. 1.

Referring to FIG. 2, a more detailed block diagram of the circuit 100 is shown. The circuit 100 further comprises a reference block (or circuit) 202 that may be provided for signal propagation compensation. The reference block 202 generally comprises a sense block (or circuit) 204 (e.g., sense CKT) and a multiplexer block (or circuit) 206. The sense block 204 may multiplexer block 206 may be configured to present the signal REF to the calibration/control block 104. In an example configuration, the multiplexer block 206 may receive one or more address signals (e.g. ADDR [m:0]) that may be connected to ground. The multiplexer block 206 may have unused inputs (not shown) that may also be connected to ground.

The calibration/control block 104 generally comprises a comparator block (or circuit) 208 and a control generator block (or circuit) 210. The comparator block 208 may receive the signal REF and the signal CAL_X. The comparator block 208 may be configured to generate a signal (e.g., CMP_OUT) to control the generator block 210 in response to the signal REF and the signal CAL_X. In an example configuration, the comparator block 208 may assert the signal CMP_OUT (e.g., to logic HIGH, or "1") when the signal REF has a greater voltage level than the signal CAL_X. When the signal REF has a lower voltage level than the signal CAL_X, the comparator block 208 may deassert the signal CMP_OUT (e.g., to a logic LOW, or "0").

The selection/control block 106 generally comprises a multiplexer block (or circuit) 212, a plurality of register blocks (or circuits) 214a–214n and a roving controller block (or circuit) 216. The multiplexer block 212 may receive a plurality of signals (e.g., CKT[n:1]) presented by the calibration blocks 102a–102n and the address signals ADDR [m:0]) The multiplexer block 212 may be configured to (i)

select one of the signals CKT[n:1] and (ii) present the selected signal CAL_X to the configuration/control block 104 in response to the address signals ADDR[m:0].

The roving controller block 216 may receive the configuration signals CONFIG. The configuration signals CONFIG may comprise one or more signals (e.g., a clock signal CLK, a reset signal RST, an enable signal EN, a test signal TEST, one or more select signals SEL[1:0], and one or more external address signals EXT_ADDR[m:0]). The roving controller block 216 may generate one or more signals (e.g., ADDR[m:0], READ, and WRITE) in response to the configuration signals CONFIG.

The register blocks 214a–214n may receive the signal CLK, the signal RST, the signal ADDR[m:0], the signal READ, the signal WRITE, the signals CNTRL[j:0] and the signals STAT[i:0]. The register blocks 214a–214n may be configured to (i) read the signals CNTRL[j:0] in response to the signal READ and (ii) write the signals CNTRL[j:0] in response to the signal WRITE.

Figure 3:
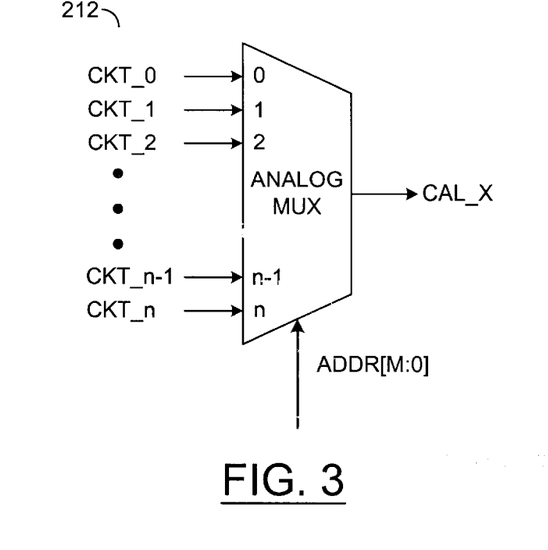
FIG. 3 is a more detailed diagram of the multiplexer block of FIG. 2.

Referring to FIG. 3, a more detailed diagram of the multiplexer block 212 is shown. In one embodiment, the multiplexer 212 may be an analog device. However, other multiplexers, such as digital multiplexers, may be implemented accordingly to meet the design criteria of a particular implementation. The multiplexer block 212 may receive the signals CAL[n:1] and the signals ADDR[m:0]. The multiplexer block 212 may be configured to (i) select one of the signals CAL[n:1] and (ii) present the selected signal CAL_X to the comparator block 208 in response to the signals ADDR[m:0].

Figure 4:
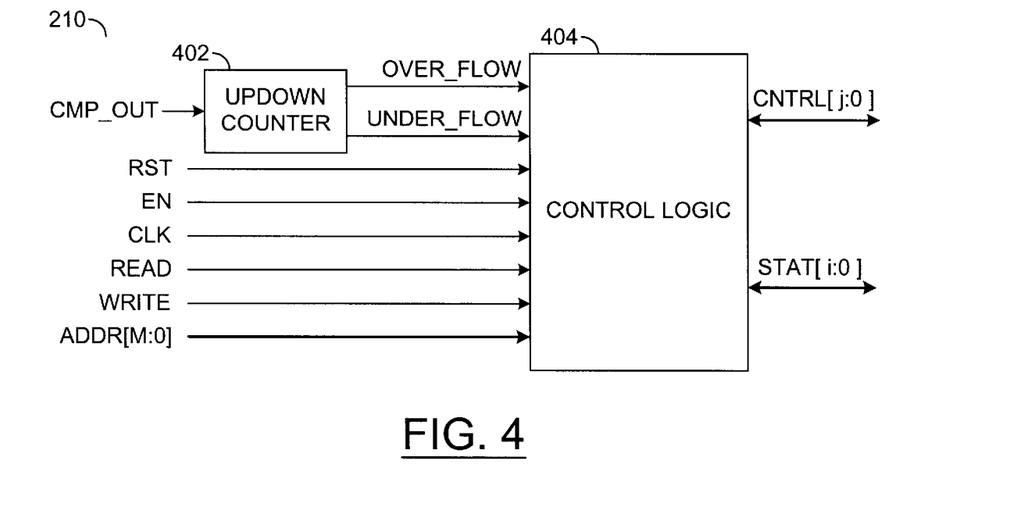
FIG. 4 is a more detailed block diagram of the control generator block of FIG. 2.

Referring to FIG. 4, a more detailed diagram of the control generator block 210 is shown. The control generator block 210 generally comprises an up-down counter block (or circuit) 402 and a control logic block (or circuit) 404. The up-down counter block 402 may receive the signal CMP_OUT and the signals RST, EN and CLK. The up-down counter block 402 may generate one or more control signals (e.g. OVER_FLOW and UNDER_FLOW) in response to one or more of the signals CMP_OUT, RST, EN and CLK. The control logic block 404 may receive the signals OVER_FLOW and UNDER_FLOW, the signals RST, EN and CLK and the signals READ, WRITE and ADDR[m:0]. The control logic block 404 may generate the signals CNTRL[j:0] and the signals STAT[i:0] in response to one or more of the signals OVER_FLOW, UNDER_FLOW, RST, EN, CLK, READ, WRITE and ADDR[m:0].

Figure 5:
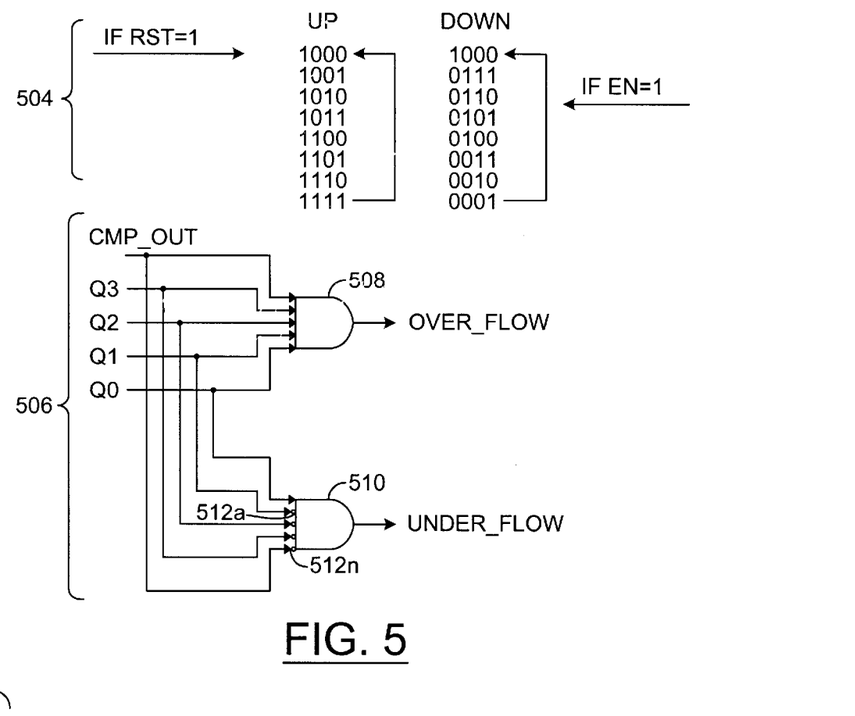
FIG. 5 is a more detailed diagram of the up-down counter block of FIG. 4.

Referring to FIG. 5, a more detailed diagram of the up-down counter block 402 is shown. The up-down counter block 402 generally comprises a counter 504 having a range (e.g., 0001 to 1111) and an output circuit 506. The up-down counter block 402 may be configured to (i) remove any instantaneous chattering errors of the comparator 208 and/or (ii) provide damping to the tracking loop in response to one or more of the signals CMP_OUT, RST, EN and CLK.

In an example configuration, the up-down counter 402 block may be controlled by the following code:

If (RST)
   COUNT=4$b'$ (1000);
else
if
   (CMP_OUT)
   COUNT=COUNT+1
   OVER_FLOW=COMP_OUT & Q0 & Q1 & Q2 & Q3
else
   COUNT=COUNT−1
UNDER_FLOW=NOT COMP_OUT & Q0 & NOT Q1 & NOT Q2 & NOT Q3

However, other appropriate code may be implemented accordingly to meet the design criteria of a particular implementation.

Upon reset, the up-down counter block 402 may be set to the mid-value (e.g., 1000) of the counter range. The counter 504 may count upward when the signal CMP_OUT is at a first logic state and downward when the signal CMP_OUT is at a second logic state.

The output circuit 506 generally comprises a gate 508, a gate 510 and a number of inverters 512a–512n. The gates 508 and 510 may be implemented, in one example, as AND gates. However, the particular polarity of the gates may be adjusted accordingly to meet the design criteria of a particular implementation. The gate 508 may receive the signal CMP_OUT and the signals Q[3:0] generated by the counter 504. The gate 508 may be configured to generate the signal OVER_FLOW in response to the signal CMP_OUT and the signals Q[3:0]. The inverter 512a may invert the signal Q1 generated by the counter 504.

The gate 510 may receive the signal Q0 and the inverted signals Q1, Q2, Q3 and CMP_OUT . The gate 510 may be configured to generate the signal UNDER_FLOW in response to one or more of the signals Q0, Q1, Q2, Q3 and CMP_OUT.

The following TABLE 1 describes a sample control logic:

TABLE 1

| CASE | OVER_FLOW | UNDER_FLOW | CNTRL [7:0] | STAT [1:0] |
|---|---|---|---|---|
| 0 (RST = 1) CLEAR_STATE = 1 | X | X | 10000000 | |
| 1 | 1 | 0 | 11000000 | |
|   | 0 | 1 | 01000000 | |
| 2 | 1 | 0 | X1100000 | |
|   | 0 | 1 | X0100000 | |
| 3 | 1 | 0 | XX110000 | |
|   | 0 | 1 | XX010000 | |
| 4 | 1 | 0 | XXX11000 | |
|   | 0 | 1 | XXX01000 | |
| 5 | 1 | 0 | XXXX1100 | |
|   | 0 | 1 | XXXX0100 | |
| 6 | 1 | 0 | XXXXX110 | |
|   | 0 | 1 | XXXXX010 | |
| 7 | 1 | 0 | XXXXXX11 | |
|   | 0 | 1 | XXXXXX01 | |

TABLE 1-continued

| CASE | OVER_FLOW | UNDER_FLOW | CNTRL [7:0] | STAT [1:0] |
|---|---|---|---|---|
| 8 | 1 | 0 | XXXXXXX1 | |
| | 0 | 1 | XXXXXXX0 | |
| | 1 | 0 | 11111111 | OVER_RANGE |
| | 0 | 1 | 00000000 | UNDER_RANGE |

TABLE 1 is an example implementation of an eight bit control logic function that may be binary weighted. A state number is shown in the column CASE and may increment with each clock cycle. The signals OVER_FLOW and UNDER_FLOW may be input signals. The signals CNTRL [7:0], OVER_RANGE and UNDER_RANGE may be output signals. The signal RST or CLEAR_RANGE may force the state number to "0" and the signals CNTRL[7:0] to "10000000". On the next clock cycle, the state counter may increment by 1 and the output signals CNTRL[7:0], OVER_RANGE and UNDER_RANGE generally depend on the condition of the input signals OVER_FLOW and UNDER_FLOW. For example, if the signal OVER_FLOW="1" and the signal UNDER_FLOW="0" the output may be "11000000". In another example, if the signal OVER_FLOW="0" and the signal UNDER_FLOW="1" the output may be "01000000".

When the state number is "8", the state counter may rest until the signal INC or the signal TIME_OUT is asserted. During any state, if the signals CNTRL[7:0] are "11111111" and the signal OVER_FLOW="1", the signal OVER_RANGE may be asserted. If the signals CNTRL[7:0] are "00000000" and the signal UNDER_FLOW="0" the signal UNDER_RANGE may be asserted.

Figure 6:
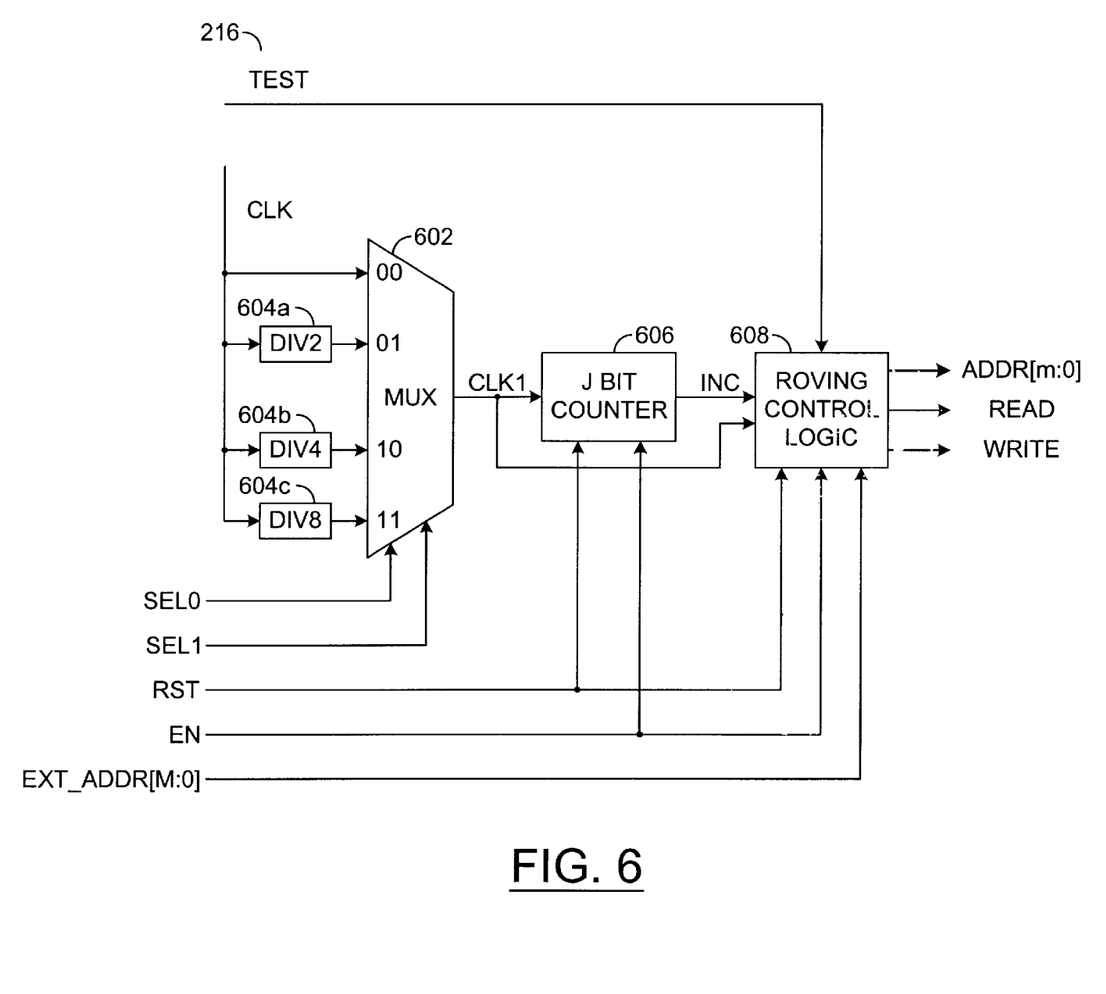
FIG. 6 is a more detailed block diagram of the roving controller block of FIG. 2.

Referring to FIG. 6, a more detailed diagram of the roving controller block 216 is shown. The roving controller block 216 generally comprises a plurality of divided clock blocks (or circuits) 604a–604c, a multiplexer block (or circuit) 602, a counter block (or circuit) 606 and a roving control logic block (or circuit) 608. The counter block 606 may be implemented, in one example, as a J-bit counter, where J is an integer. The divided clock blocks 604a–604c may each receive the signal CLK. The divided clock blocks 604a–604n may each be configured to generate an oscillating signal (e.g., DIV2, DIV4, DIV8, etc.) that may be a fractional frequency (e.g., ½, ¼, ⅛, etc.) of the signal CLK.

The multiplexer block 602 may receive the signals CLK, SEL0, SEL1, div2, div4 and div8. The multiplexer block 602 may be configured to (i) select one of the plurality of oscillating signals and (ii) present the selected signal (e.g., CLK1) to the J-bit counter block 606 in response to the signals SEL0 and SEL1.

The J-bit counter block 606 may receive the signals RST, EN, and CLK1. The J-bit counter block 606 may be configured to generate a signal (e.g., INC) in response to the signals RST, EN and CLK1. In one example the J-bit counter block 606 may be reset to a zero when the signal RST is asserted or when the signal EN is de-asserted. Upon overflow, the J-bit counter block 606 may generate the signal INC.

The roving control logic block 608 may receive the signals TEST, RST, EN, EXT_ADDR[m:0], CLK1 and INC. The roving control logic block 608 may be configured to generate the signals ADDR[m:0], READ and WRITE in response to the signals RST, EN, INC, TEST and EXT_ADDR[m:0].

Figure 7:
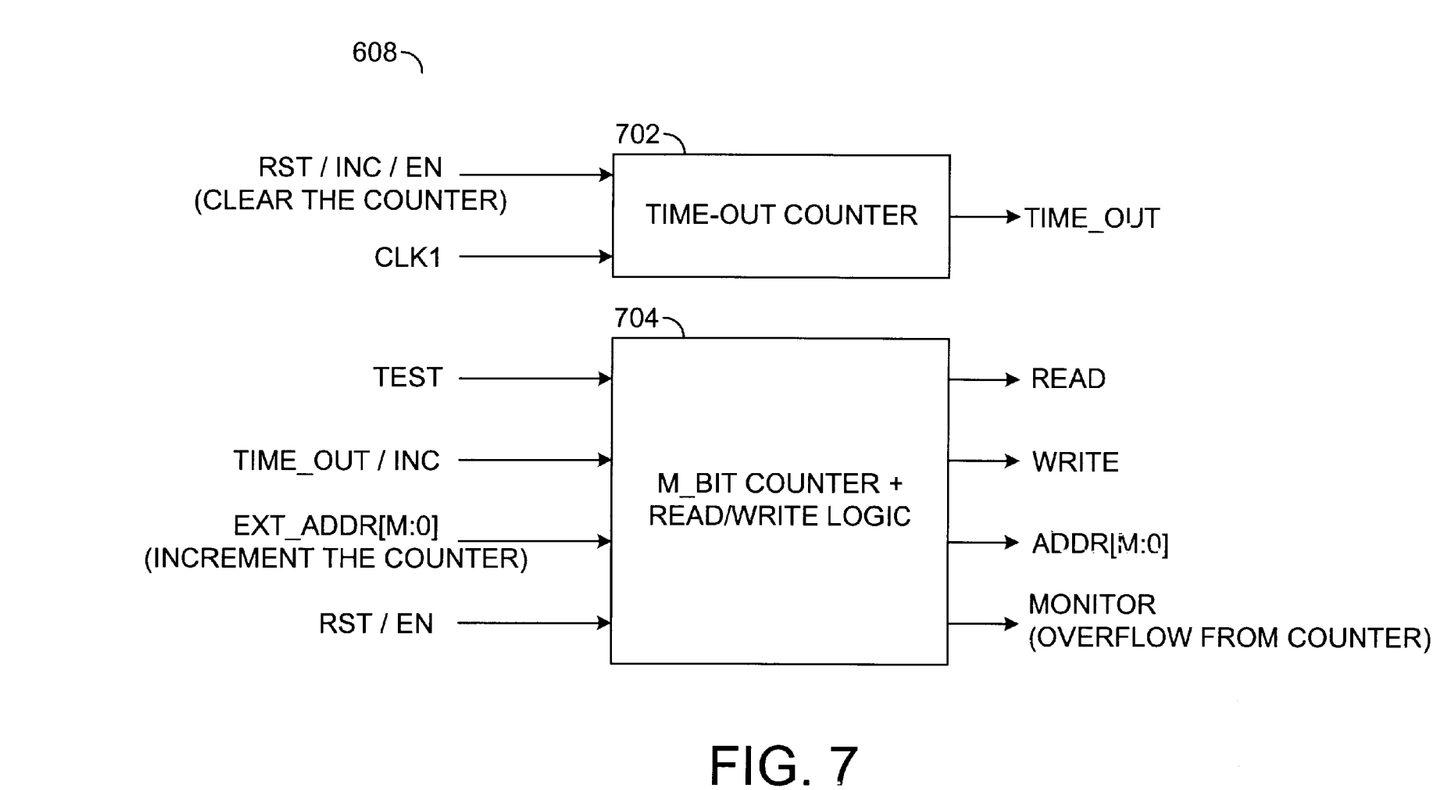
FIG. 7 is a more detailed block diagram of the roving controller logic block of FIG. 6.

Referring to FIG. 7, a more detailed diagram of the roving control logic block 608 is shown. The roving control logic block 608 generally comprises a counter block 702 (e.g., a time-out counter) and a logic block 704. In one example, the logic block 704 may be an m_bit counter and read/write logic. The time-out counter block 702 may receive the signal RST, the signal EN, the signal INC and the signal CLK1. The time-out counter block 702 may be configured to generate the signal TIME_OUT in response to one or more of the signals RST, INC, EN and CLK1. In one example, the time-out counter block 702 may be clocked by the signal CLK1 and cleared by the signals RST, INC or EN. The signal TIME_OUT may be generated in response to the expiration of the time out counter 702.

The logic block 704 may receive the signals RST, EN, TEST, EXT_ADR[m:0] and TIME_OUT. The logic block 704 may be configured to generate the signals READ, WRITE, ADDR[m:0] and MONITOR in response to one or more of the signals RST, EN, INC, TIME_OUT, TEST and EXT_ADDR[m:0]. In an example configuration, an assertion of TIME_OUT or INC may generate the signals ADDR[m:0]. The signals ADDR[m:0] may select the next calibration circuit block 102 (e.g. CKT_X+1) for calibration. When the signal TEST is asserted, the signals ADDR [m:0] are generated in response to the signals EXT_ADDR [m:0]. Therefore, a user can select any circuit for calibration or monitoring.

Figure 8:
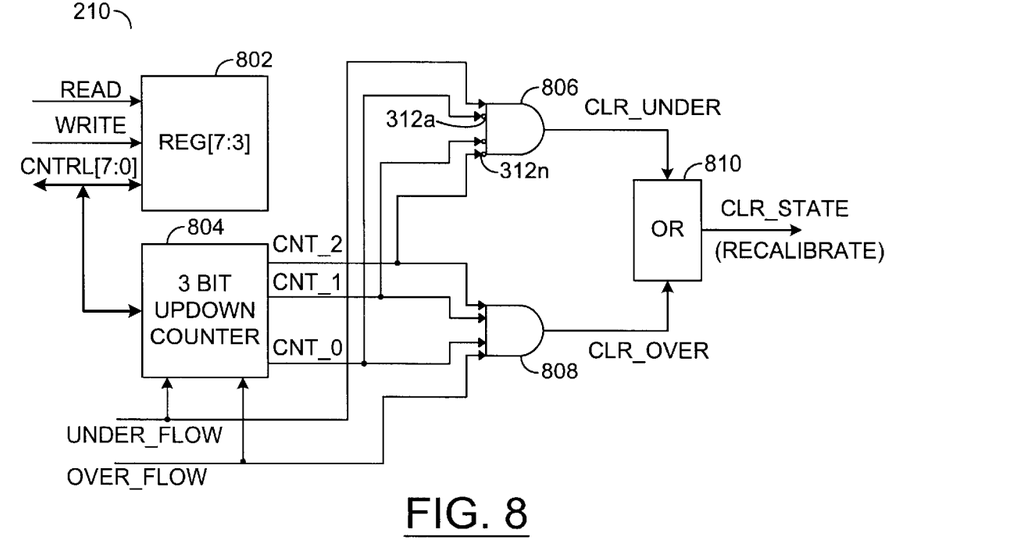
FIG. 8 is a more detailed block diagram of the register block of FIG. 2.

Referring to FIG. 8, a more detailed diagram of the register and control logic of the control generator 210 is shown. This register is the master register to all slave registers of the register block 214. The register block 214 generally comprises a register block 802, an up-down counter block 804, a gate 806, a gate 808, a gate 810, and a number of inverters 812a–812n. The register block 802 may receive the signals CNTRL[7:0], the signal READ and the signal WRITE.

The up-down counter block 804 may receive the signals CNTRL[2:0], OVER_FLOW and UNDER_FLOW. The up-down counter block 804 may be configured to generate the signals CNT_0, CNT_1, and CNT_2 in response to the signals CNTRL[2:0], OVER_FLOW and UNDER_FLOW. Inverters 812a–812n may invert the signals presented to the gate 806.

The gates 806 and 808 may be implemented, in one example, as AND gates. However, other gates may be implemented accordingly to meet the design criteria of a particular implementation. The gate 806 may receive the signals CNT_0, CNT_1, CNT_2 and UNDER_FLOW. The gate 806 may generate a signal (e.g. CLR_UNDER) in response to the signals NOT CNT_0, NOT CNT_1, NOT CNT_2 and UNDER_FLOW. The gate 808 may receive the signals CNT_0, CNT_1, CNT_2 and OVER_FLOW. The gate 808 may generate a signal (e.g., $CLR_{13}$ OVER) in response to the signals CNT_0, CNT_1, CNT_2 and OVER_FLOW.

The gate 810 may be configured, in one example, as an OR gate. The gate 810 may receive the signal CLR_OVER and the signal CLR_UNDER. The gate 810 may generate a signal (e.g., CLR_STATE) in response to the signals CLR_OVER and CLR_UNDER. The signal CLR_STATE may reset the calibrate logic as shown in TABLE 1. The circuit of FIG. 8 is generally active during the monitor state.

In an example configuration of the calibration/control block 104 and the selection/control block 106, the signals CNTRL[j:0] may be generated in response to the selected calibration circuit CKT_X. When the signal READ is asserted, signals CNTRL[j:0] may be written into the register block 802. The WRITE signal may be asserted one clock cycle after the READ signal is asserted. When the WRITE signal is asserted, the contents of the register 802 and the up-down counter 804 may be written to (i) CNTRL [j:0] and (ii) the selected calibration circuit CKT_X. The roving controller 216 and the register 214 are generally written by a single source. The assertion of the signal WRITE may cause the register 214 to output data to CNTRL [7:0] and latch the data at the master register 802. The assertion of the READ signal generally latches the data by the register block 214 from the signal CNTRL[7:0] which is driven by the register 802.

When either (i) the signals CNT[2:0] are all logic HIGH or "1" and the signal OVER_RANGE is asserted or (ii) the signals CNT[2:0] are all at logic LOW or "0" and the signal UNDER_RANGE is asserted, the signal CLR_STATE may be asserted by the OR gate 810. The assertion of the signal CLR_STATE may reset the state counter shown in TABLE 1 and initiate a calibration cycle again. After each calibration, the signals CNTRL[j:0] and the signals STATE [i:0] may be latched at the circuit CKT_X before the circuit CKT_X+1 is calibrated. In the event that the roving controller block 216 is locked in a particular calibration cycle, the signal TIME_OUT may be asserted. The assertion of either the signal TIME_OUT or the signal INC may increment the m_bit counter and read/write control logic block 704 and may force the roving controller 216 to calibrate the next calibration circuit CKT_X+1.

Figure 9:
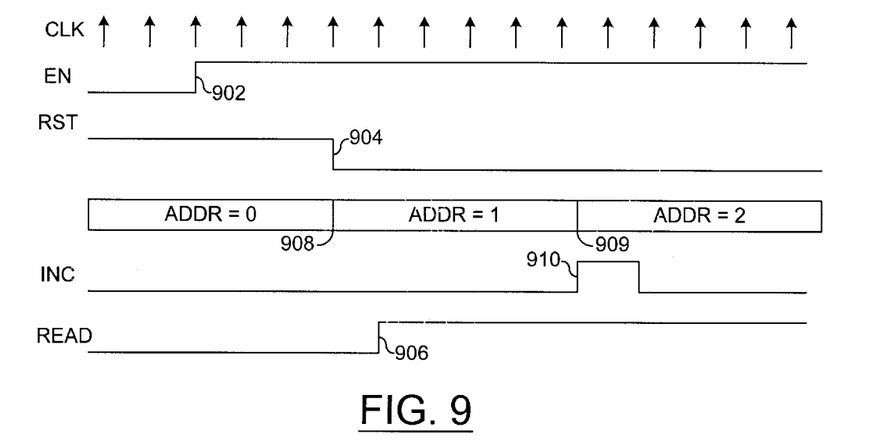
FIG. 9 is a timing diagram for the control bus during a calibration condition.

Referring to FIG. 9, a timing diagram of various signals of FIG. 2 during a calibration is shown. The signal EN may have a positive transition 902. The signal RST may have a negative transition 904. The signal bus ADDR may have an address change 908 that generally responds to the transition 904 of the signal RST. The signal READ may have a positive transition 906 that generally responds to the incrementation 908 of the signal bus ADDR. The signal INC may have a positive transition 910 that generally responds to an address change 909 of the signal ADDR.

Figure 10:
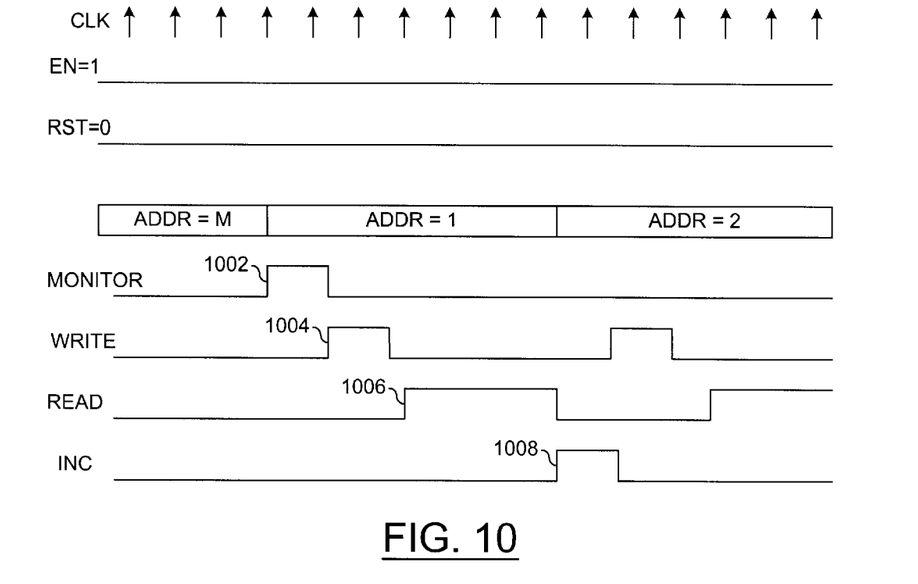
FIG. 10 is a timing diagram for the control bus during a monitoring condition.

Referring to FIG. 10, a timing diagram of various signals of FIG. 2 during the monitoring condition is shown. The signal MONITOR generally has a positive transition 1002. The signal WRITE generally has a positive transition 1004 that may respond to the transition 1002 of the signal MONITOR. The signal READ generally has a positive transition 1006 that generally responds to the transition 1004 (after a delay) of the signal WRITE. The signal INC has a positive transition 1008 that generally responds to a negative transition 1009 of the signal READ.

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a plurality of first calibration circuits each configured to present a calibration signal;
   a second circuit configured to (i) select one of said calibration signals in response to a plurality of configuration signals, (ii) latch a control signal into said selected calibration circuit and (iii) read said control signal; and
   a third circuit configured to generate said control signal in response to (i) a reference signal and (ii) said selected calibration signal.

2. The circuit according to claim 1, wherein said second circuit comprises a selection circuit.

3. The circuit according to claim 1, wherein said third circuit comprises a calibration circuit.

4. The circuit according to claim 1, wherein said second circuit is configured by a user to (i) select one of said first calibration circuits, (ii) latch said control signal and (iii) read said control signal.

5. The circuit according to claim 1, wherein said second circuit is configured to select one of said calibration signals in response to an externally generated address.

6. The circuit according to claim 1, further comprising:
   a propagation circuit configured to generate said reference signal.

7. The circuit according to claim 2, wherein said selection circuit comprises a multiplexer, a register, a counter and a roving controller configured to generate one or more signals in response to said configuration signals.

8. The circuit according to claim 3, wherein said calibration circuit comprises a comparator, a counter and control logic.

9. The circuit according to claim 7, wherein said roving controller comprises a multiplexer, a counter, and control logic.

10. The circuit according to claim 7, wherein said selection circuit selects said calibration circuits, latches said control signal and reads said control signal continuously.

11. The circuit according to claim 1, wherein said second circuit presents said control signal to a device outside of said circuit.

12. A method for selecting and calibrating a plurality of circuits comprising the steps of:
   (A) generating a plurality of calibration signals;
   (B) selecting one of said calibration signals in response to a plurality of configuration signals;
   (C) generating a control signal in response to (i) a reference signal and (ii) said selected calibration signal; and
   (D) latching said control signal indicating said selected calibration circuit.

13. The method according to claim 12, wherein step (B) selects said calibration signal in response to an external address signal.

14. The method according to claim 12, further comprising the step of:
   presenting said control signal to an external device outside of said circuit.

15. A circuit comprising:
   means for generating a plurality of calibration signals;
   means for selecting one of said calibration signals in response to a plurality of configuration signals;
   means for generating a control signal in response to (i) a reference signal and (ii) said selected calibration signal; and
   means for (i) latching said control signal into said selected calibration circuit and (ii) reading said control signal.

16. The circuit according to claim 15, further comprising:
   means for presenting said control signal outside of said circuit.

17. A circuit comprising:

a plurality of first calibration circuits each configured to present a calibration signal;

a second circuit configured to select one of said calibration signals in response to a plurality of configuration signals;

a third circuit configured to generate a control signal in response to (i) a reference signal and (ii) said selected calibration signal; and a propagation compensation circuit configured to generate said reference signal.

* * * * *